United States Patent [19]

Baudouin et al.

[11] Patent Number: 5,208,732
[45] Date of Patent: May 4, 1993

[54] MEMORY CARD WITH FLEXIBLE CONDUCTOR BETWEEN SUBSTRATE AND METAL COVER

[75] Inventors: Daniel Baudouin, Missouri City; Alton Carpenter, Houston; James Wallace, Sugarland, all of Tex.

[73] Assignee: Texas Instruments, Incorporated, Dallas, Tex.

[21] Appl. No.: 707,353

[22] Filed: May 29, 1991

[51] Int. Cl.⁵ .............................. H05K 7/20
[52] U.S. Cl. .................. 361/386; 361/395; 257/713
[58] Field of Search .............. 174/51, 252, 260; 357/81; 165/80.3, 185; 235/441, 492; 361/382, 383, 386, 389, 392, 395, 396, 399, 424, 387, 388

[56] References Cited

U.S. PATENT DOCUMENTS

| | | |
|---|---|---|
| 3,372,310 | 3/1968 | Kantor . |
| 4,092,697 | 5/1978 | Spaight ............... 361/387 |
| 4,386,388 | 5/1983 | Beun . |
| 4,612,601 | 9/1986 | Watari ............... 361/387 |
| 4,716,498 | 12/1987 | Ellis ............... 361/395 |
| 4,771,365 | 9/1988 | Cichocki ............... 361/387 |
| 4,789,347 | 12/1988 | Banjo et al. . |
| 4,798,946 | 1/1989 | Fjuii et al. . |
| 4,811,165 | 3/1989 | Currier et al. . |
| 4,837,664 | 6/1989 | Rodriguez, II ............... 361/386 |
| 4,838,804 | 6/1989 | Banjo et al. . |
| 4,854,883 | 8/1989 | Tuckwood . |
| 4,864,116 | 9/1989 | Banjo et al. . |
| 4,872,091 | 10/1989 | Maniwa et al. . |
| 4,889,498 | 12/1989 | Mizuta . |
| 4,941,835 | 7/1990 | Lasmayoux et al. . |
| 4,975,805 | 12/1990 | Schmutzler . |
| 5,016,845 | 10/1991 | Pinnovaia ............... 361/395 |
| 5,038,250 | 8/1991 | Uenakat ............... 361/395 |

Primary Examiner—Gerald P. Tolin
Attorney, Agent, or Firm—Leo Heiting; Richard Donaldson; Lawrence J. Bassuk

[57] ABSTRACT

A memory card has a housing including an interior chamber and a top metal cover. A substrate is located in the interior chamber and carries printed circuit leads, packaged semiconductor devices connected to selected printed circuit leads, and a connector connected to selected printed circuit leads. The packaged semiconductor devices are spaced from the top metal cover and a thermal coupler is located between the top metal cover and the packaged semiconductor devices for coupling heat generated by the packaged semiconductor devices to the top metal cover.

7 Claims, 5 Drawing Sheets

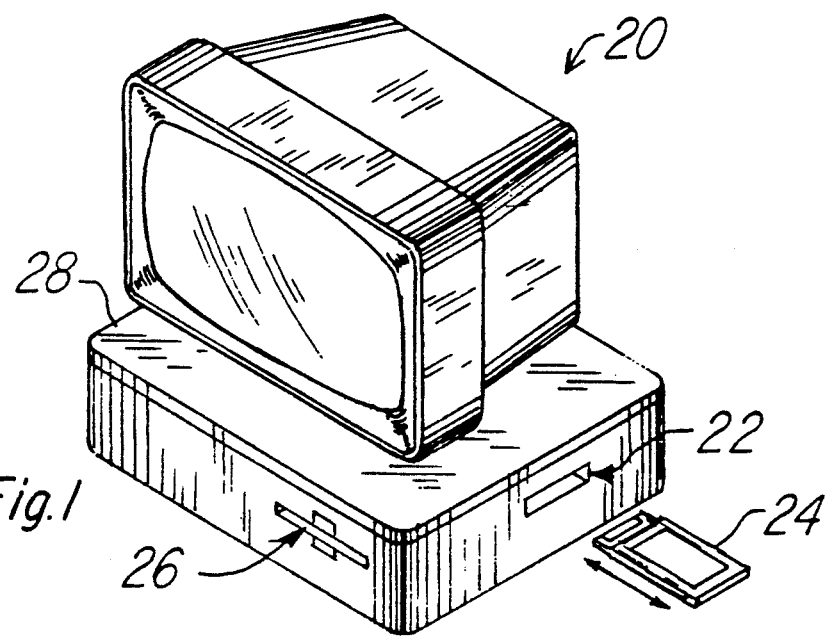
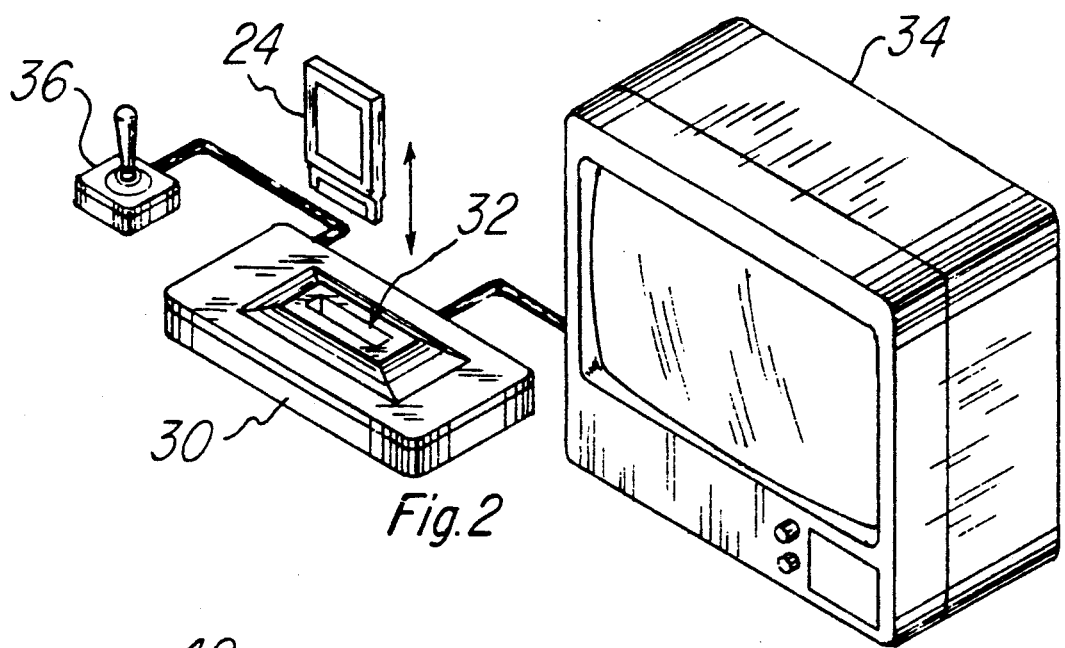
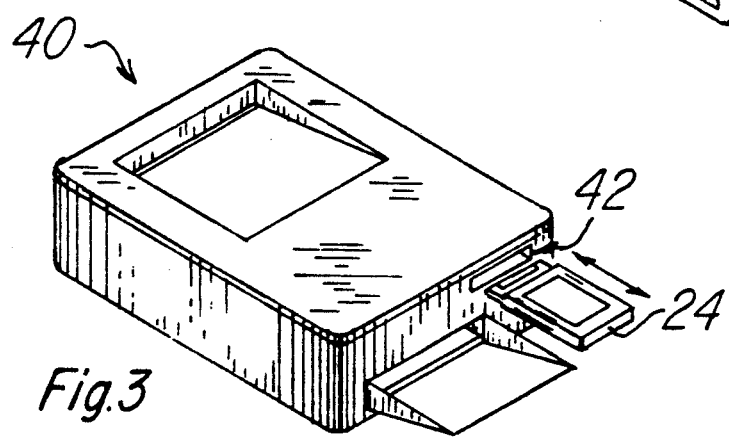

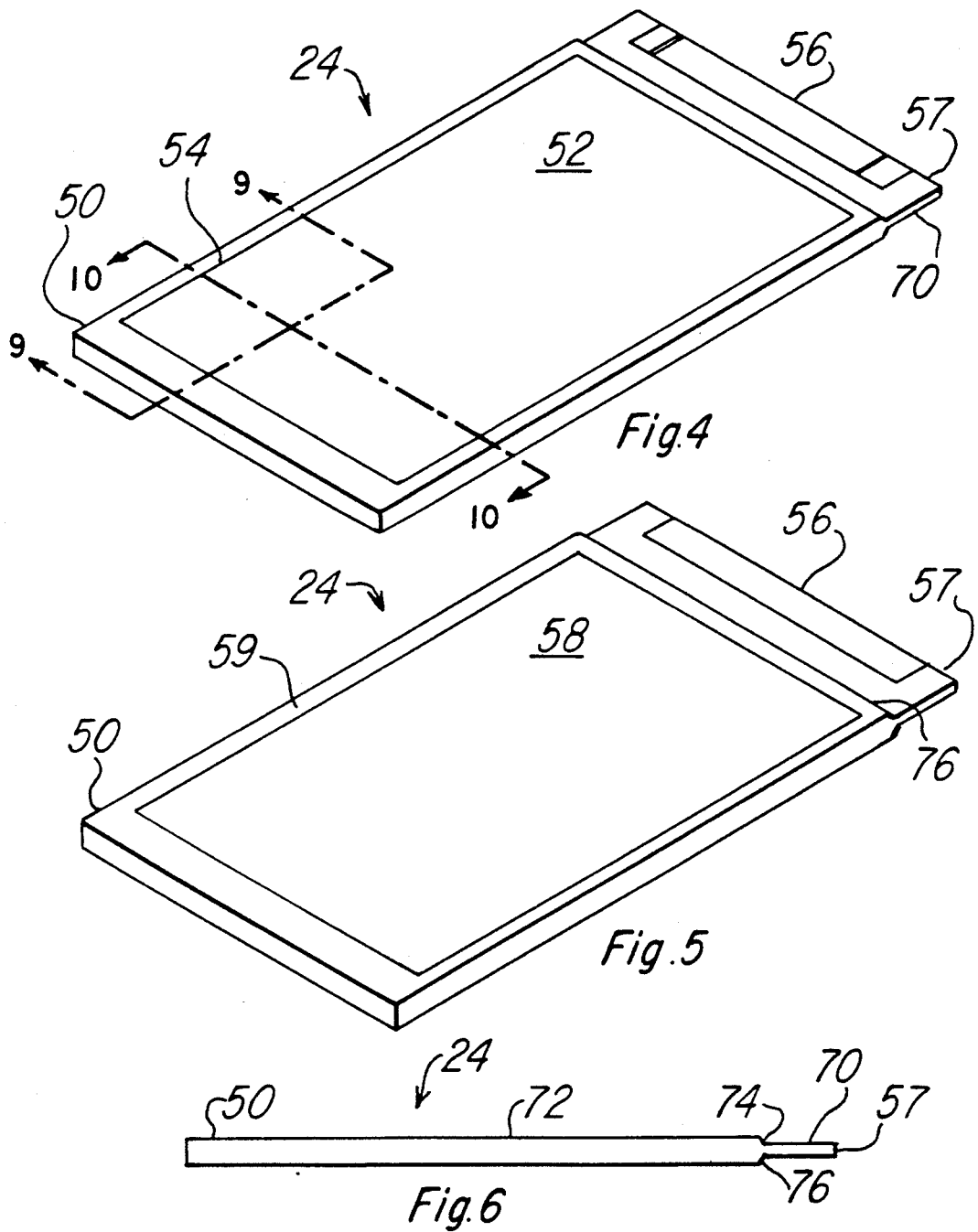

MEMORY CARD WITH FLEXIBLE CONDUCTOR BETWEEN SUBSTRATE AND METAL COVER

CROSS-REFERENCE TO RELATED APPLICATIONS

The following coassigned patent application is hereby incorporated herein by reference:

| Serial No. | Filing Date | TI Case No. |
| --- | --- | --- |
| 07/515,809, now U.S. Pat. No. 5,061,845. | 04/30/90 | 15197 |

FIELD OF THE INVENTION

This invention generally relates to the field of packaging plural semiconductor devices in a common container. More particularly, this invention relates to memory cards containing plural semiconductor memory and related devices, such as DRAMs, SRAMs, ROMs, EPROMs, EERPOMs, and PROMs or other nonvolatile memory, in a container about the size of a credit card that is readily handled by a user and pluggable in desired equipment.

BACKGROUND OF THE INVENTION

Credit card sized memory cards are commercially available, such as MF3129-M7DAC01 from Mitsubishi Electric Corporation. This particular card contains 128 KB of static random access memory (SRAM) powered by a contained battery. The card container has dimensions of about 85×54×about 3.4 millimeters, has an electrical connector at one end and a cavity at the other end for receiving and holding the battery. It also has a slide switch at the other end operated to turn a write protect feature on and off.

The referenced memory card is constructed by mounting the individual semiconductor memory and related devices on a thin printed circuit board and attaching a connector to the board. A plastic molded frame having a marginal and transverse skeleton and internal openings mates with the printed circuit board and connector combination. Top and bottom panels of such as sheet metal then mount over the openings through the frame to enclose the printed circuit board and semiconductor devices. Later, the battery can be inserted in its opening and be secured in place with a plastic holder and screw. Adhesive sheets, one each on the top and bottom, secure the panels in place.

Memory cards find utility in numerous electronic systems. In personal computers they supplement or replace floppy disks by carrying software programs and data and are connected to the internal logic through a port on such as the side of the computer cabinet. Portable personal computers, notebook computers, and pocket diaries particularly find memory cards convenient because they avoid the need for the expense, power requirements, bulk, and weight of a disk drive; the memory card needs only an electrical connector and minimal structural support.

Facsimile and copy machines can use a memory card to store data related to usage control. Typewriters and printers can use a memory card to store desired memory fonts. Word processors can use a memory card to store text. Hand-held terminals can use memory cards to store inventory control information. Electronic cash registers can use memory cards to store price information. Controllable machinery can use memory cards to store automation control information. Programmable controllers can use memory cards to store process control data. Electronic game systems can use memory cards to store the specifics of games to be enacted on TV screens by the players.

Other areas that can benefit from the use of memory cards include bulk data acquisition such as in music and photography, where the desired song or picture is stored in the memory devices of the card.

SUMMARY OF THE INVENTION

It has been discovered that as the density of memory cards increases through the use of high density, high power dissipating semiconductor chips and also through the use of greater numbers of semiconductor chips, the evacuation of heat from the memory card is a problem.

Generally, and in one form of the invention, a memory card comprises a housing including an interior chamber and a top metal cover. A substrate is located in said chamber and carries printed circuit leads, packaged semiconductor devices connected to selected printed circuit leads, and a connector connected to selected printed circuit leads. The packaged semiconductor devices are spaced from the top metal cover. A thermal coupler is located between the top metal cover and the packaged semiconductor devices for coupling heat generated by the packaged semiconductor devices to the top metal cover.

BRIEF DESCRIPTION OF THE DRAWINGS

In the drawings:

FIG. 1 is a perspective view of a personal computer using the memory card of the invention;

FIG. 2 is a perspective view of a game controller using the memory card of the invention;

FIG. 3 is a perspective view of a laser printer using the memory card of the invention;

FIG. 4 is a perspective view of the top of a memory card of the invention;

FIG. 5 is a perspective view of the bottom of a memory card of the invention;

FIG. 6 is a side elevation view of the memory card of the invention;

Corresponding numerals and symbols in the different figures refer to corresponding parts unless otherwise indicated.

DETAILED DESCRIPTION OF PREFERRED EMBODIMENTS

Figure 7:
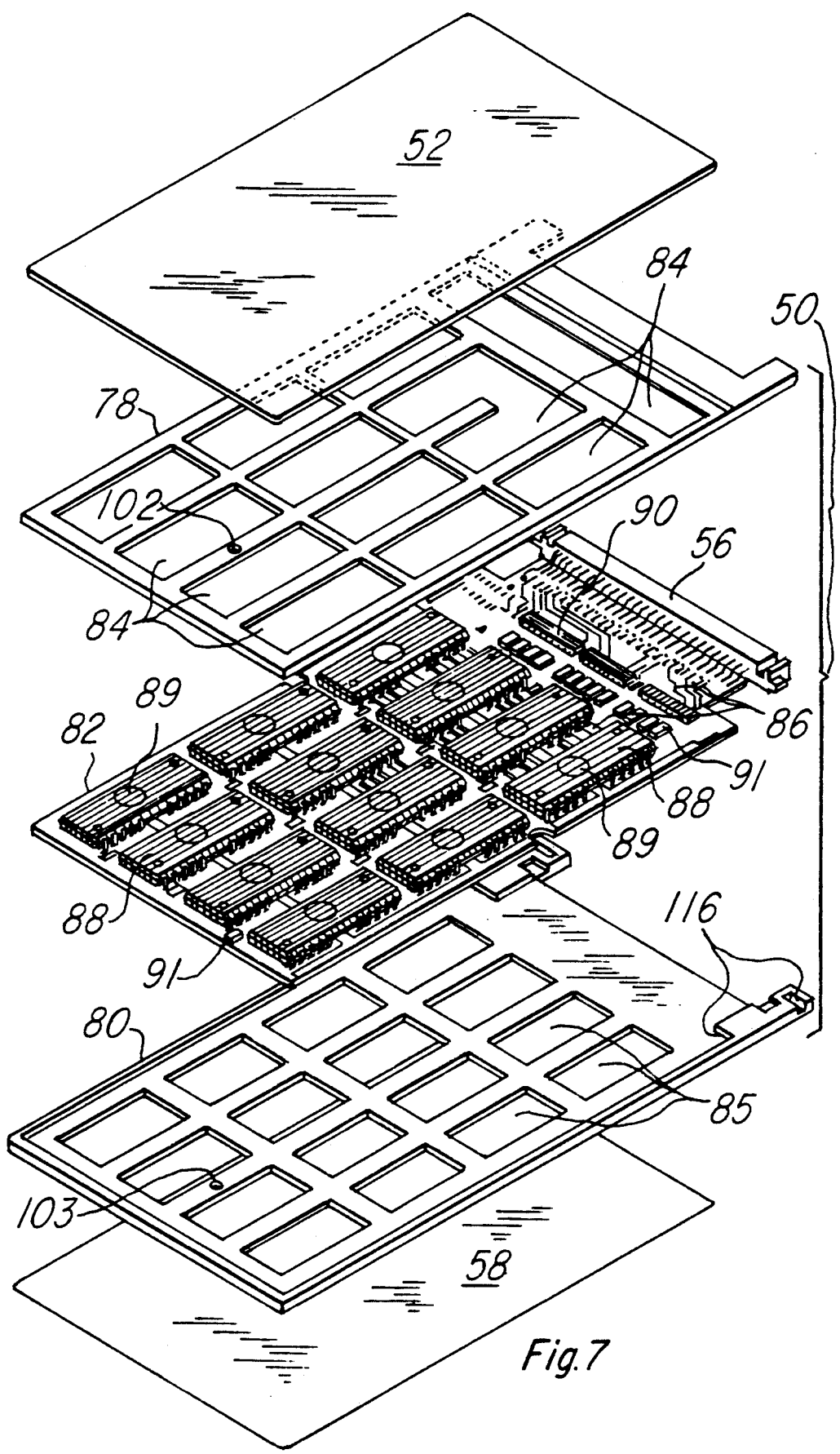
FIG. 7 is an exploded perspective view of the memory card of the invention.

In FIG. 1, personal computer 20 includes a port 22 for receiving a memory card 24 of the invention. Memory card 24 can be used for any one of several purposes, including augmenting the semiconductor memory of the personal computer, presenting software or data to the personal computer through the port 22 or reconfiguring the personal computer 20 through information stored in the solid state or semiconductor memory devices carried in memory card 24. Memory card 24 can be used in addition to or in place of floppy disk port 26, also located on the cabinet 28 of the personal computer.

In FIG. 2, a game controller 30 receives the memory card 24 through a port 32. In this instance, the memory card 24 carries software and data for the controller to execute a game displayed on TV 34 in response to the user effecting actions on the joystick 36.

In FIG. 3, laser printer 40 receives memory card 24 at port 42 for controlling the type fonts or other desired features of the laser printer.

FIG. 4 shows a perspective view of the top of memory card 24 of the invention. Memory card 24 includes a shell 50, preferably made of plastic, and a top metal cover 52 that fits in a recessed area 54 in the top part of the shell 50. Connector 56 is located in a notch 55 in shell 50 and extends flush with front end 57 of shell 50. Connector 56 can be a standard connector available from Molex or DuPont.

FIG. 5 shows a perspective view of the bottom of memory card 24. Memory card 24 includes a bottom metal cover 58 that fits in a recessed area 59 in the bottom part of the shell 50.

FIG. 6 is a side elevation view of memory card 24 of the invention. Memory card 24 includes a body portion 72 and a neck portion 70. Neck portion 70 extends from lips 74 and 76 and has dimensions which facilitate mating with a male connector in the bottom of the port in which memory card 24 is inserted. In a preferred embodiment, the neck portion has a thickness of about 3 millimeters and the body portion 72 has a thickness of about 3.4 millimeters.

FIG. 7 is an exploded perspective view of memory card 24. Memory card 24 includes top metal cover 52, shell 50 formed of first or top part 78 and second or bottom part 80, substrate 82, and bottom metal cover 58. Top and bottom parts 78 and 80 of shell 50 are joined together at their margins, for example, by ultrasonic welding or an adhesive, to form an interior chamber containing the substrate 82. Top part 78 of shell 50 includes plural apertures 84 opening to the contained chamber. Bottom part 80 includes plural apertures 85 also opening to the contained chamber. Top and bottom parts 78 and 80 of shell 50 are made of a material, such as plastic, which is lightweight but sufficiently rigid to protect substrate 84.

Top and bottom metal covers 52 and 58 are joined to top and bottom parts 78 and 80 with an adhesive, for example. Metal covers 52 and 58 add rigidity to memory card 24 to prevent excessive flexing of substrate 82.

Substrate 82 carries printed circuit leads 86, plural packaged semiconductor devices 88 and connector 56. The packaged semiconductor devices 88 and the connector 56 are connected to selected leads 86 to implement a desired memory device function. Semiconductor devices 88 may include twelve 256K×4 DRAM memory devices manufactured by Texas Instruments, Inc. under part number TMS44-C256DN. Other semiconductor devices, such as devices 90, may also be provided to perform driving, decoding, or other selected logic functions. Packaged semiconductor devices 88 and 90 are aligned with apertures 84 to extend into apertures 84 after assembly of memory card 24. Additional electrical components 91, which may be decoupling capacitors for example, can also be mounted on substrate 82 as desired. A thermal coupler 89 contacts the top surface 110 of each packaged device 88 for conducting heat from an associated device 88 to top metal cover 52. Although not shown, a thermal coupler could also contact the top surface of each packaged device 90, if desired, for conducting heat from an associated device 90 to top metal cover 52.

Figure 8:
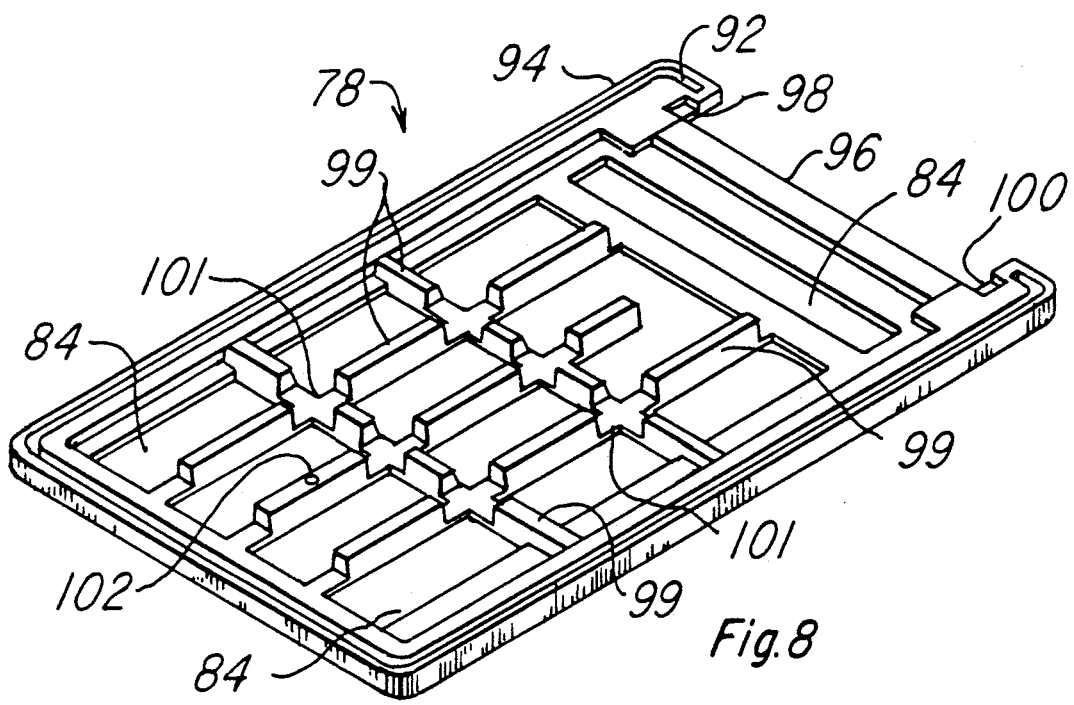
FIG. 8 is perspective view of the underside of the shell top part of the memory card of the invention.

As seen in FIG. 8, the underside of top portion 78 presents a tongue 92 in the form of a small bead of material extending along the upstanding outer margin 94 adjacent front edge 57. Tongue 92 mates with groove 116 shown in FIG. 7 to assist in alignment of top and bottom parts 78 and 80. Top part 78 also presents an upstanding wall 96 and a pair of pockets 98 and 100. Wall 96 and pockets 98 and 100 serve to position and retain the connector 56 and to provide strain relief when inserting the connector into a mating connector or unplugging the connector 56 from a mating connector.

Top part 78 includes a plurality of upstanding ribs 99 adjacent apertures 84. Ribs 99 contact the top surface of substrate 82 when memory card 24 is assembled. Ribs 99 of top part 78 cooperate with bottom part 80 to securely hold substrate 82. Top part 78 also includes recessed areas 101 located adjacent ribs 99. Components 91, which are not as tall as packaged semiconductor devices 88, can be positioned on substrate 82 so that they fit in recessed areas 101 when memory card 24 is assembled.

Figure 9:
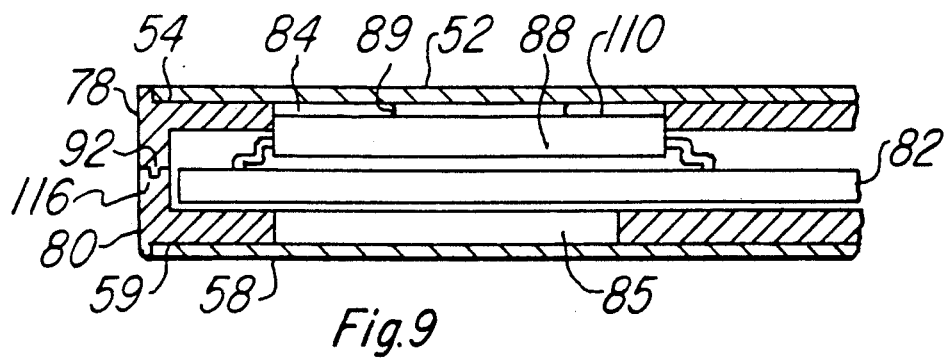
FIG. 9 is an enlarged partial sectional view of the memory card taken along the line 9—9 in FIG. 4.

As seen in FIG. 9, substrate 82 rests in chamber 108 with packaged devices 88 extending upwardly through aperture 84. Top surfaces 110 of packaged devices 88 are spaced from cover 52 preferably by a distance of approximately 10 mils. Thermal coupler 89 extends from top surface 110 of packaged devices 88 to cover 52. Thermal coupler 89 efficiently transfers heat generated by operation of packaged devices 88 to top metal cover 52 which, in turn, dissipates the heat to the ambient air.

In the preferred embodiment, thermal coupler 89 is a thermally conductive glue such as, RTV Silicone Rubber Adhesive SWS934 available from Wacker Silicone Corporation, which is placed on top surfaces 110 of packaged devices 88. A drop of thermally conductive glue is placed on each high-power dissipation packaged device 88. Each drop extends in a vertical direction sufficiently so that top metal cover 52, when positioned in recessed area 54 of top part 78 during assembly, will contact the drops and spread them in a horizontal direction. The spacing between the top surfaces 110 of packaged devices 88 and top metal cover 52 may vary slightly between different packaged devices 88 due to variations in packaging, for example. The pliability of the drops of thermally conductive glue when initially applied ensures that any variable spacing between the top surfaces 110 of packaged devices 88 and cover 52 will be filled. The drops of thermally conductive glue harden to provide a permanent thermal coupling between packaged semiconductor devices 88 and top metal cover 52 and to further assist in limiting movement of substrate 82 within chamber 108.

Grease having high thermal conductivity or metal springs welded to the underside of top cover 52 and contacting top surfaces 110 of devices 88 may also be used as thermal coupler 89.

The bottom surface of substrate 82 rests on the top surface of bottom part 80. Some of the heat produced by packaged devices 88 will not be conducted to top metal cover 52 but will be conducted by leads on packaged devices 88 or will radiate from the bottom of the packaged devices 88 to raise the temperature of substrate 82. Apertures 85 in bottom part 80 permit heat to radiate freely from the bottom of substrate 82 to bottom metal cover 58 for dissipation to the ambient air.

Top metal cover 52 and bottom metal cover 58 serve as a heat sink for memory card 24. Covers 52 and 58 are made from a metal having high thermal conductivity, such as aluminum. The high thermal conductivity and large surface areas of covers 52 and 58 exposed to the ambient air serve to effectively dissipate heat generated by semiconductor devices contained within memory card 24. Top and bottom metal covers 52 and 58 may be provided with fins to increase the surface area exposed to ambient air, if so desired.

Figure 10:
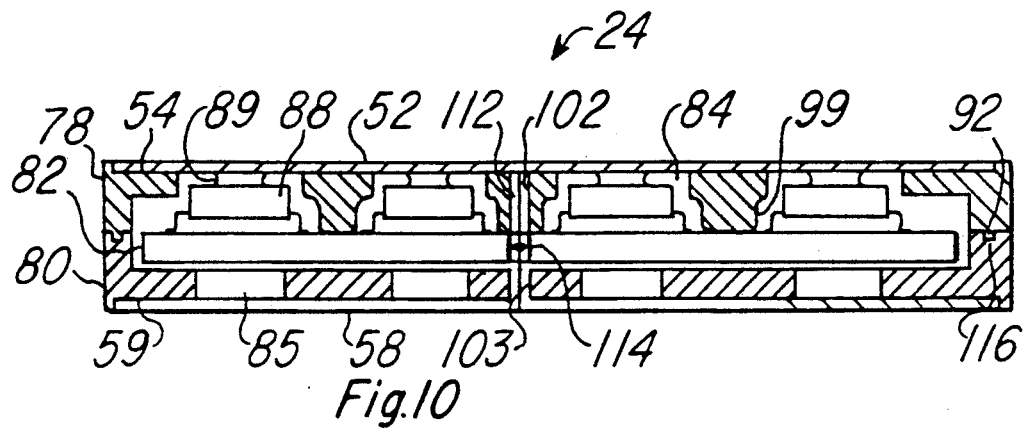
FIG. 10 is an enlarged sectional view of the memory card taken along the line 10—10 in FIG. 4.

As seen in FIG. 10, a flexible conductor 112, which may be a metal spring, is soldered to plated through hole 114 in substrate 82. Plated through hole 114 is electrically connected to a printed circuit lead 86 which serves as ground. Conductor 112 extends through a hole 102 in one of ribs 99 of top part 78 to contact top metal cover 52 and through a hole 103 in bottom part 80 to contact bottom metal cover 58. In addition to acting as heat sinks, grounded metal covers 52 and 58 act as a Faraday cage to protect packaged devices 88 and 90 from electrostatic discharge and as a shield against radio frequency and electromagnetic radiation.

Figure 11:
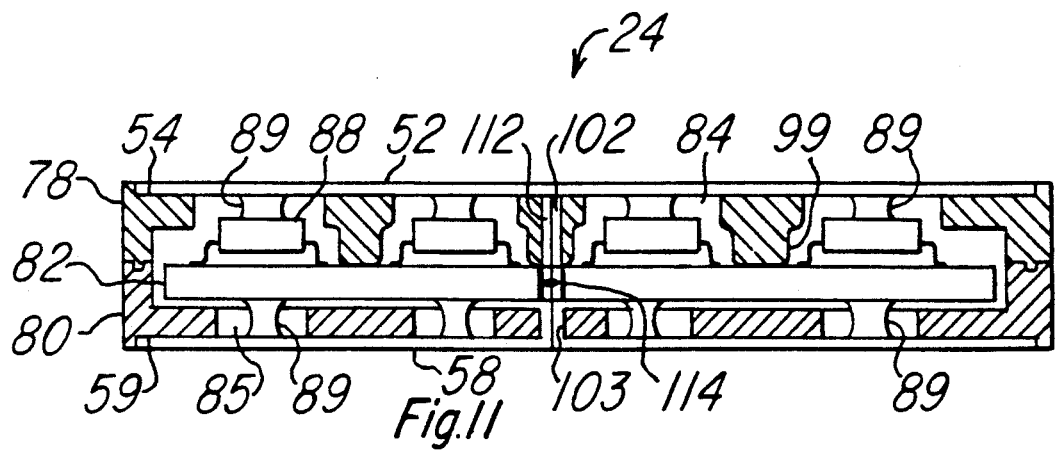
FIG. 11 is an enlarged sectional view of a second embodiment of a memory card of the invention taken along the line 10—10 in FIG. 4.

FIG. 11 is an enlarged sectional view of a second embodiment of a memory card of the invention. Memory card 24 of FIG. 11 is identical to the memory card of FIG. 10 with the exception that additional thermal couplers 89 are located in apertures 85 of bottom part 80 and extend from substrate 82 to bottom metal cover 58. Thermal couplers 89 in apertures 85 provide increased efficiency in transferring heat from substrate 82 to bottom metal cover 58.

Figure 12:
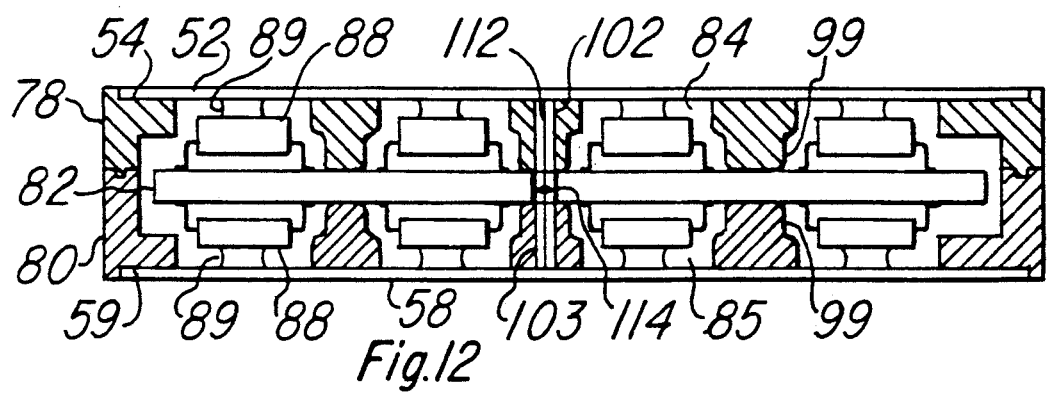
FIG. 12 is an enlarged sectional view of a third embodiment of a memory card of the invention taken along the line 10—10 in FIG. 4.

FIG. 12 is an enlarged sectional view of a third embodiment of a memory card of the invention. Memory card 24 of FIG. 12 is identical to the memory card of FIG. 10 with the exception that substrate 82 carries printed circuit leads and plural packaged semiconductor devices 88 on both top and bottom surfaces. Additional thermal couplers 89 extend from devices 88 on the bottom of substrate 82 to bottom metal cover 58. Bottom part 80 may also be provided with ribs 99 and recessed areas (not shown) between adjacent ribs which function in the same fashion as ribs 99 and recessed areas 101 of top part 78.

Figure 13:
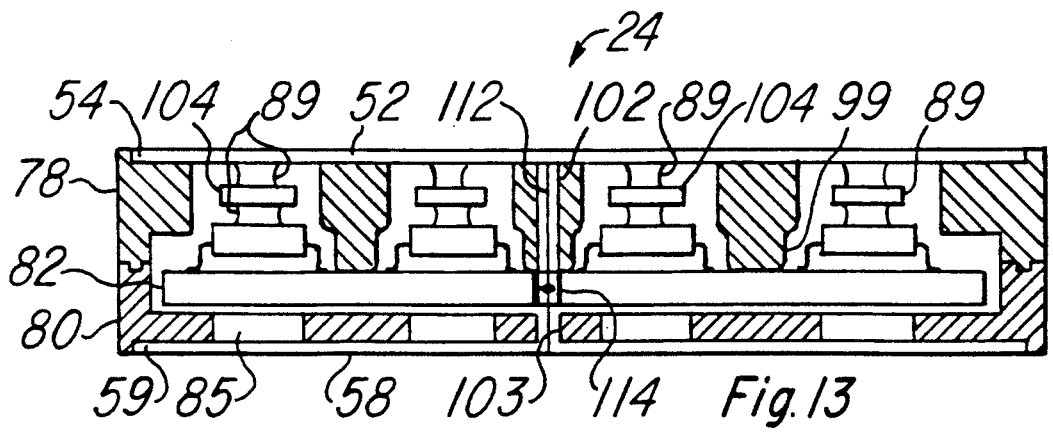
FIG. 13 is an enlarged sectional view of a fourth embodiment of a memory card of the invention taken along the line 10—10 in FIG. 4.

FIG. 13 is an enlarged sectional view of a fourth embodiment of a memory card of the invention. Memory card 24 of FIG. 13 is identical to the memory card of FIG. 10 with the exception that the thermal coupler between devices 88 and top metal cover 52 comprises a metal plate 104 sandwiched between thermal glue areas 89. This arrangement is enhances thermal coupling when the spacing between devices 88 and top metal cover 52 is large.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. A memory card, comprising:
   a housing including an interior chamber and a top metal cover;
   a substrate in said chamber, said substrate carrying printed circuit leads, packaged semiconductor devices connected to selected printed circuit leads, and a connector connected to selected printed circuit leads, said packaged semiconductor devices being spaced from said top metal cover, said substrate including a plated through hole connected to circuit ground and a flexible conductor soldered in said plated through hole and extending through said housing to contact said top metal cover; and
   a thermal coupler between said top metal cover and said packaged semiconductor devices for coupling heat generated by said packaged semiconductor devices to said top metal cover.

2. The memory card of claim 1 in which said thermal coupler comprises a thermally conductive glue.

3. The memory card of claim 2 in which said thermally conductive glue is a silicone rubber adhesive.

4. The memory card of claim 1 in which said housing includes a shell having a top part, said top part having a plurality of first apertures, said packaged semiconductor devices extending into said first apertures, said top metal cover attached to said top part to cover said first apertures.

5. The memory card of claim 4 in which said shell has a bottom part having a plurality of second apertures, said top and bottom parts joined at their margins.

6. The memory card of claim 5 in which said housing includes a bottom metal cover attached to said bottom part to cover said second apertures.

7. The memory card of claim 5 in which said top part includes a plurality of ribs which contact said substrate, said substrate carrying electrical components which extend into recessed areas located between said ribs.

* * * * *